United States Patent
Shiraishi et al.

(10) Patent No.: US 7,825,423 B2
(45) Date of Patent: Nov. 2, 2010

(54) SEMICONDUCTOR DEVICE AND METHOD OF MANUFACTURING SEMICONDUCTOR DEVICE

(75) Inventors: Akinori Shiraishi, Nagano (JP); Yuichi Taguchi, Nagano (JP); Masahiro Sunohara, Nagano (JP); Hideaki Sakaguchi, Nagano (JP); Naoyuki Koizumi, Nagano (JP); Kei Murayama, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 11/700,761

(22) Filed: Feb. 1, 2007

(65) Prior Publication Data
US 2007/0194712 A1    Aug. 23, 2007

(30) Foreign Application Priority Data
Feb. 2, 2006    (JP) .............................. P2006-025649

(51) Int. Cl.
*H01L 29/22* (2006.01)
*H01L 29/24* (2006.01)

(52) U.S. Cl. ................... 257/98; 257/99; 257/100; 257/E33.056; 257/E33.058; 257/E33.067; 257/E33.072; 257/E33.073; 438/22

(58) Field of Classification Search .......... 257/98–100, 257/E33.056, E33.058, E33.059, E33.067, 257/E33.072, E33.073; 438/22; 313/498–500, 313/512
See application file for complete search history.

(56) References Cited

U.S. PATENT DOCUMENTS

| 7,078,734 B2* | 7/2006 | Hiramoto ..................... 257/98 |
| 7,312,477 B2* | 12/2007 | Yatsuda et al. ................ 257/98 |
| 2004/0070338 A1* | 4/2004 | Noguchi et al. ............. 313/512 |
| 2004/0211970 A1* | 10/2004 | Hayashimoto et al. ........ 257/98 |
| 2005/0230691 A1* | 10/2005 | Amiotti et al. ................ 257/79 |
| 2006/0011935 A1* | 1/2006 | Krames et al. ................ 257/99 |
| 2006/0038194 A1* | 2/2006 | Terashima et al. ............ 257/98 |
| 2006/0049421 A1* | 3/2006 | Suehiro et al. ................ 257/99 |
| 2007/0029569 A1* | 2/2007 | Andrews ..................... 257/99 |
| 2007/0152231 A1* | 7/2007 | Destain ....................... 257/99 |
| 2007/0170454 A1* | 7/2007 | Andrews .................... 257/100 |

FOREIGN PATENT DOCUMENTS

JP    2003-110146    4/2003

\* cited by examiner

*Primary Examiner*—Kenneth A Parker
*Assistant Examiner*—Joseph Nguyen
(74) *Attorney, Agent, or Firm*—Drinker Biddle & Reath LLP

(57) ABSTRACT

In a semiconductor device 100, a light emitting device 102 is mounted on a substrate 101. A light reflection preventing film 130 for preventing a reflection of a light is formed on an upper surface of the light emitting device 102. Moreover, a plate-shaped cover 103 formed of a glass having a light transparency is disposed above the light emitting device 102, and a light reflection preventing film 140 for preventing a reflection of a light is also formed on an upper surface of the cover 103.

12 Claims, 14 Drawing Sheets

SEMICONDUCTOR DEVICE AND METHOD OF MANUFACTURING SEMICONDUCTOR DEVICE

TECHNICAL FIELD

The present disclosure relates to a semiconductor device and a method of manufacturing the semiconductor device, and more particularly to a semiconductor device in which an optical functional device such as a light emitting device or a light receiving device is mounted on a substrate and a method of manufacturing the semiconductor device.

RELATED ART

In a semiconductor device in which a light emitting device is mounted on a substrate, various shapes have been proposed. For example, in the case in which the light emitting device is an LED (light emitting diode), a type of a luminescent color thereof is limited. In order to obtain a desirable luminescent color, therefore, a phosphor for emitting a light corresponding to a light emission of the LED is used and a compound color of a light emission of the LED and that of a phosphor is utilized in some cases.

For example, a related-art semiconductor device in which a light emitting device is mounted have such a structure that a light emitting device is mounted in a concave portion of a substrate and an upper opening of the concave portion is sealed with an optical member (glass) such as a glass, and a fluorescent member formed on a lower surface of the optical member emits a light upon receipt of a light emitted from the light emitting device, thereby increasing an intensity of a light emitted from the optical member (for example, see Patent Document 1: Japanese Patent Unexamined Publication No. 2003-110146).

In the related-art semiconductor device, however, when a light emitted from a light emitting device passes through a boundary surface having different refractive indices in a process in which the light is transmitted through an optical member covering a concave portion of a substrate and is thus projected, there occurs the following problem. In the case in which the light proceeds from an optical member having a high refractive index (a refractive index=1.5) to the air having a low refractive index (a refractive index=1.0), for example, a total reflection is generated by an angle of incidence of the light with respect to the boundary surface. For this reason, there is a problem in that an amount of the light transmitted through the optical member is decreased, resulting in a reduction in a light intensity.

Moreover, the total reflection of the light implies a phenomenon generated when the light proceeds from a medium having a high refractive index to a medium having a low refractive index. When the light is irradiated from an inner part of the light emitting device to an outside, therefore, there is a possibility that the phenomenon might be generated. In such a case, although the light emitting device has a structure in which the light is irradiated toward an upper surface of the light emitting device, the light subjected to the total reflection in the inner part of the light emitting device is irradiated from a side surface of the light emitting device. For this reason, there is also a problem in that an intensity of the light emitted from the upper surface of the light emitting device as an original light emitting surface is reduced.

SUMMARY

Embodiments of the present invention provide a semiconductor device.

One or more embodiments of the invention have the following means.

One or more embodiments of the invention provides a semiconductor device in which an optical functional device is mounted on a substrate, wherein a cover having a light transparency is disposed above the optical functional device, and a light reflection preventing film for preventing a reflection of a light is formed on at least one of the cover or the optical functional device.

One or more embodiments of the invention is characterized in that the cover has the light reflection preventing film formed on at least one of a front surface or a back surface.

One or more embodiments of the invention is characterized in that the light reflection preventing film is a transparent film formed by coating a dielectric film.

One or more embodiments of the invention is characterized in that the optical functional device is a light emitting device for emitting a light, and a reflector for reflecting a light is disposed to surround a side surface of the light emitting device.

One or more embodiments of the invention is characterized in that the optical functional device is mounted in a concave portion of the substrate and the concave portion is sealed by bonding the cover to the substrate.

Moreover, one or more embodiments of the invention provides a method of manufacturing a semiconductor device comprising the steps of mounting an optical functional device on a substrate, sealing the optical functional device disposed on the substrate by using a cover having a light transparency, and forming a light reflection preventing film on at least one of the cover or the optical functional device.

One or more embodiments of the invention is characterized in that the substrate is provided with a concave portion for mounting the optical functional device, and an opening of the concave portion is sealed with the cover.

One or more embodiments of the invention is characterized in that the optical functional device is a light emitting device for emitting a light, and the method further comprises the step of disposing a reflector for reflecting a light to surround a side surface of the light emitting device.

One or more embodiments of the invention is characterized by the steps of bonding an upper end of the reflector to the cover, and bonding a lower end of the reflector around a region, on which the optical functional device is mounted, of the substrate, thereby sealing a space in which the optical functional device is mounted.

According to one or more embodiments of the invention, the cover having a light transparency is disposed above the optical functional device and the light reflection preventing film for preventing the reflection of the light is formed on at least one of the cover or the optical functional device. Also in the case in which the angle of incidence of the light irradiated from the optical functional device or incident from the outside is greater than a critical angle, therefore, the light can be transmitted through the optical functional device or the cover to proceed without a reflection. Consequently, it is possible to increase an amount of the light emitted from the optical functional device or that of the light incident from the outside, thereby enhancing light intensities of a light emission and a light receipt more greatly.

Other features and advantages may be apparent from the following detailed description, the accompanying drawings and the claims.

DETAILED DESCRIPTION

One or more embodiments of the invention will be described below with reference to the drawings.

First Embodiment

Figure 1:
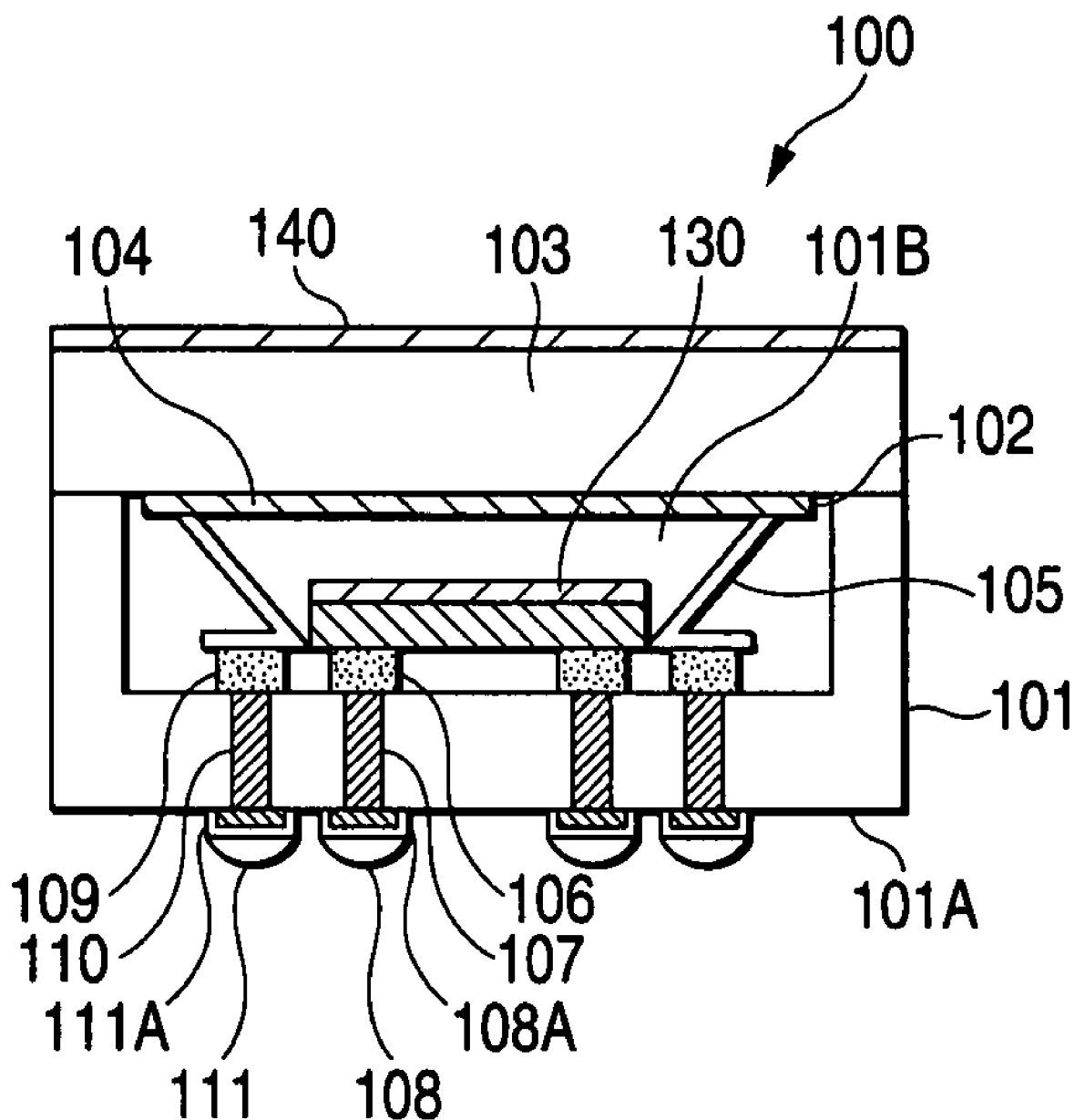
FIG. 1 is a view showing a semiconductor device according to a first embodiment of the invention.

FIG. 1 is a sectional view typically showing a semiconductor device 100 according to a first embodiment of the invention. Referring to FIG. 1, the semiconductor device 100 is obtained by mounting a light emitting device 102 formed by an LED, for example, as an optical functional device, on a substrate 101 formed of Si, for example. The light emitting device 102 has a P layer, an N layer and an electrode formed thereon by using sapphire ($Al_2O_3$) as a base material, and an upper surface thereof is provided with a light reflection preventing film 130 for preventing a reflection of a light. For example, the light reflection preventing film 130 is a transparent film obtained by coating a dielectric film having a high light transmittance, in a single-layer or a multilayer, through a vacuum evaporation method, spin coating process, or etc.

When a light irradiated from an inner part of the light emitting device 102 to an outside passes through the upper surface (a boundary surface for a refractive index) of the light emitting device 102 and proceeds in the air, therefore, a total reflection of the light can be prevented from being caused by a difference in the refractive index.

In the first embodiment, description will be given to a structure in which the light emitting device 102 is mounted on the substrate 101. It is a matter of course that the invention can also be applied to a semiconductor device having a structure in which a light receiving device is mounted, for example, instead of the light emitting device. In that case, the light reflection preventing film 130 can increase an intensity of a light which is incident from an outside and is received with a prevention of a reflection thereof.

Description will be given to a principle of the generation of the total reflection of a light. For example, it has been known that a refraction of a light is generated on a boundary between substances A and B having different refractive indices. In the case in which a light proceeding in the substance A reaches an incident point of a boundary surface, an angle formed by a normal with respect to the boundary surface on the incident point and an incident ray is referred to as an angle of incidence. In the case in which the angle of incidence is set to be equal to or greater than a certain angle, the light is not transmitted but a so-called total reflection is generated. At this time, an angle of incidence at which the total reflection is generated is referred to as a critical angle or a critical angle of the total reflection. The critical angle is determined by a ratio of the refractive indices of the substances A and B.

In the case in which a refractive index n1 of the substance A, a refractive index n2 of the substance B and a critical angle θf are set, a relationship between the refractive index and the critical angle is expressed in the following equation (1).

$$\operatorname{Sin} \theta f = n2/n1 \qquad (1)$$

In this case, it is required that the refractive index n1 of the substance A and the refractive index n2 of the substance B satisfy the condition of the following equation (2) in order to generate the total reflection.

$$n1 > n2 \qquad (2)$$

Accordingly, a refractive index (=1.0) of the air is lower than a refractive index (=1.8) of the sapphire substrate. In the case in which the light irradiated from the inner part of the light emitting device 102 to the outside has an angle of incidence with respect to a boundary surface which is greater than the critical angle θf, therefore, the total reflection is generated so that the emitted light cannot proceed to the outside of the light emitting device 102 depending on the angle of incidence.

In the first embodiment, the light reflection preventing film 130 is formed on an upper surface to be a light emitting surface (a boundary surface for a refractive index) of the light emitting device 102. In the case in which the angle of incidence is equal to or greater than the critical angle, therefore, a light proceeding from the inner part of the light emitting device 102 to the outside is prevented from being reflected by the light reflection preventing film 130. Consequently, the light can be transmitted upward. Thus, an amount of the light emission of the light emitting device 102 itself is increased so that an intensity of a light transmitted from a light emitting surface is enhanced.

Moreover, a light transmitting plate-shaped cover 103 formed of a glass, for example, is disposed above the light emitting device 102 and a light reflection preventing film 140 for preventing a reflection of a light is also formed on an upper surface of the cover 103. The light reflection preventing film 140 is constituted by a single-layer or multilayer reflection preventing film in the same manner as the light reflection preventing film 130, and the reflection of the light can be prevented to relatively increase the amount of the light transmitted through the cover 103. In a process in which the light emitted from the light emitting device 102 is transmitted through the cover 103 and proceeds from the cover 103 formed of a glass having a high refractive index to the air having a low refractive index, therefore, the total reflection can be prevented. Consequently, it is possible to enhance an intensity of a light proceeding in an upward direction of the cover 103.

In the first embodiment, the description has been given to the example of the structure in which the light reflection preventing film 130 is formed on the upper surface of the light emitting device 102 and the light reflection preventing film 140 is also formed on the upper surface of the cover 103 in order to increase the intensity of the light irradiated from the semiconductor device 100. In the invention, however, it is also possible to employ a structure in which both of the light reflection preventing films 130 and 140 are formed or either of the light reflection preventing films 130 and 140 is formed. By employing a structure in which the light reflection preventing film is formed on a lower surface of the cover 103 as well as the upper surface thereof, moreover, it is possible to increase a light transmittance, thereby enhancing an intensity of the light in the case in which a phosphor film 104 to be described below is formed by a substance having a higher refractive index than that of the glass, for example.

In the first embodiment, the description has been given to the structure in which the light emitting device 102 is mounted on the substrate 101. However, it is a matter of course that the invention can also be applied to a semiconductor device having a structure in which a light receiving device is mounted instead of the light emitting device, for example. In that case, the light reflection preventing films 130 and 140 prevent a reflection of a light incident from an outside, thereby increasing an intensity of a light to be received.

Furthermore, the phosphor film 104 is formed on the lower surface of the cover 103. For this reason, the light emitting device (LED) is not directly coated with a phosphor film or a resin containing a phosphor in the semiconductor device 100 according to the first embodiment. Consequently, the radiation of the light emitting device 102 can be enhanced, resulting in suppression in the influence of deterioration in quality due to the heat generation of the light emitting device.

In the phosphor film 104, moreover, the influence of deterioration due to the radiation from the light emitting device 102 and the irradiation of ultraviolet rays can be suppressed so that the quality of the semiconductor device can be improved and a lifetime can be prolonged.

Furthermore, a concave portion 101B for mounting the light emitting device 102 is formed on the substrate 101 and the periphery of the concave portion 101B is bonded to the cover 103 so that the light emitting device 102 is sealed over the substrate 101. More specifically, in the structure, a space for sealing the light emitting device 102 is formed by the substrate 101 and the cover 103. Therefore, the space for sealing the light emitting device 102 can be brought into a pressure reducing state, for example, or can be filled with an inactive gas. Thus, the quality of the light emitting device 102 can be maintained and a lifetime can be prolonged.

When the substrate 101 is connected to the cover 103 through anode bonding, moreover, a space for sealing the light emitting device 102 is held more cleanly than that in the case in which they are bonded through an organic material such as a resin. Therefore, the quality of the light emitting device 102 can be enhanced, which is preferable.

Moreover, a reflector 105 for reflecting a light emitted from the light emitting device 102 is disposed together with the light emitting device 102 in the space (the concave portion 101B) in which the light emitting device 102 is sealed. With the structure, consequently, a light emitting efficiency of the semiconductor device 100 according to the first embodiment can be enhanced.

Furthermore, the light emitting device 102 is disposed on a bump (Au bump) 106 formed of Au, for example, and is electrically connected to a via plug (through wiring) 107 formed to penetrate through a bottom face of the substrate 101 via the bump 106.

A connecting layer 108A formed by an Ni/Au plated layer, for example, is provided on an opposite side to a side of the via plug 107 on which the light emitting device 102 is connected, and furthermore, a solder bump 108 is formed on the connecting layer 108A. More specifically, the via plug 107 is formed so that the light emitting device 102 and a connecting target on an outside of the space for sealing the light emitting device 102 can easily be connected to each other. Although a connecting layer formed by the Ni/Au plated layer, for example, may be provided between the bump 106 and the via plug 107, moreover, it is not shown in the drawing.

In addition, the reflector 105 is connected to a via plug (radiation wiring) 110 penetrating through the substrate 101. Therefore, the radiating property of the reflector 105 can be enhanced. In this case, the via plug 110 has the same structure as the via plug 107.

For example, the reflector 105 is connected to the via plug 110 formed to penetrate through the bottom face of the substrate 101 through a bump (Au bump) 109. A connecting layer 111A constituted by an Ni/Au plated layer, for example, is formed on the opposite side to a side of the via plug 110 on which the reflector 105 is connected, and furthermore, a solder bump 111 is formed on the connecting layer 111A. In this case, the reflector 105 is cooled (radiated) through the via plug 110. Moreover, it is more suitable that the via plug 110 (the solder bump 111) should be constituted to be connected to a mother board, resulting in an excellent radiating property, for example.

If the substrate 101 is formed of Si, for example, it can easily be processed to have a fine shape, which is preferable. For example, Si has such a feature that micromachining can be carried out more easily than a material such as ceramic. If the substrate 101 is formed of Si, moreover, it is also possible to carry out anode bonding together with the cover 103 formed of a glass (a borosilicate glass).

Moreover, an oxide film (a silicon oxide film) 101A is formed on a surface of the substrate 101, and the substrate 101 is insulated from the via plugs 107 and 110 and the bumps 106 and 109, for example.

Figure 2:
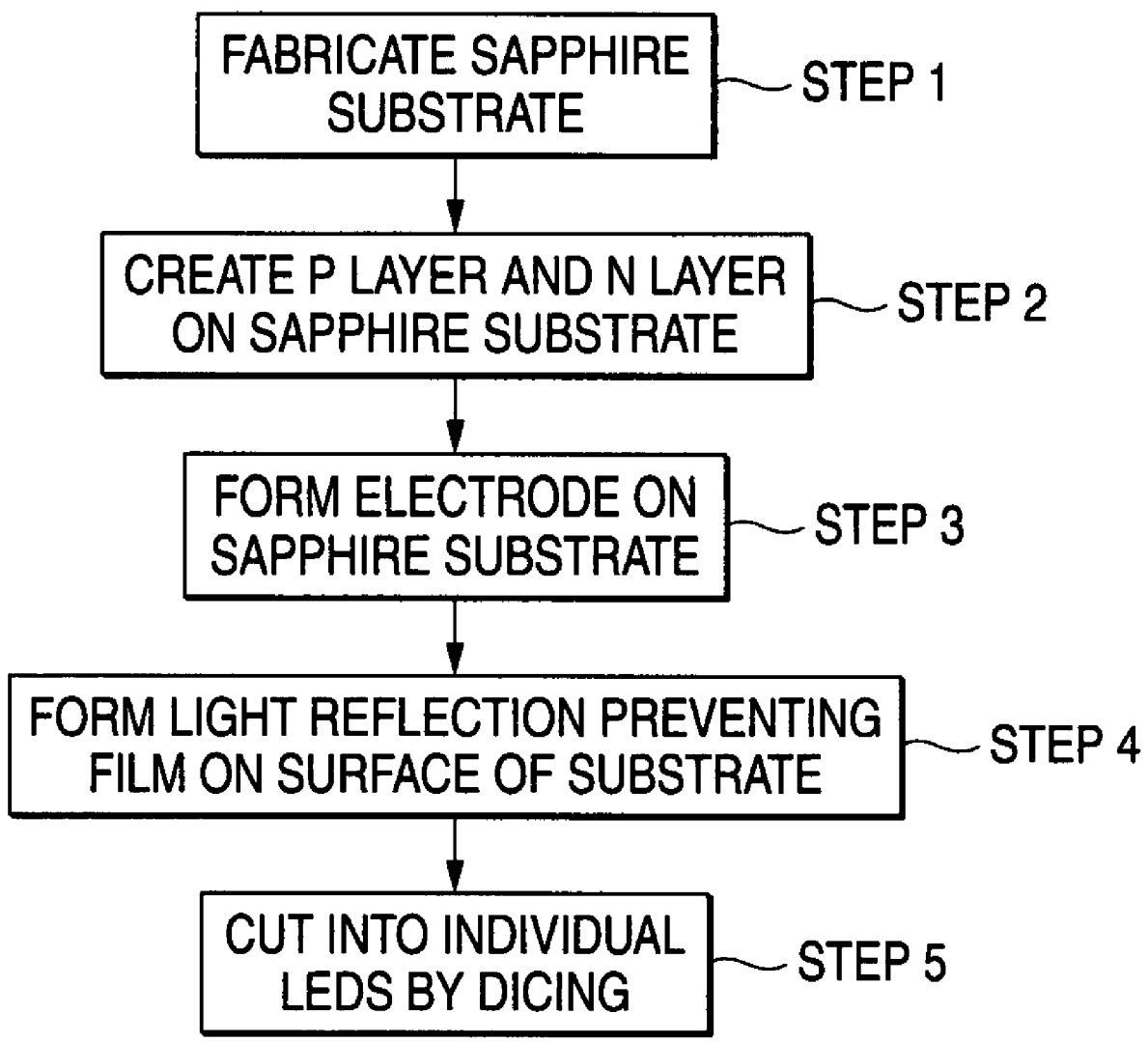
FIG. 2 is a diagram showing a procedure for a method of manufacturing a light emitting device 102.

With reference to FIG. 2, description will be given to a procedure for a method of manufacturing the light emitting device 102. As shown in FIG. 2, first of all, a sapphire wafer having a predetermined thickness is created in a step 1. Sapphire is excellent in a light transparency and a heat resistance, and particularly, also has such a durability that it is deteriorated with difficulty even if a light is converted into a heat to carry out heating to a high temperature with respect to a blue light emitting member. Therefore, the sapphire is suitable for an LED substrate.

In a next step 2, a thin film constituted by a compound such as gallium nitride (NGa) is epitaxial grown on the sapphire substrate by using a film forming method such as a vapor phase growth, thereby forming a P-type semiconductor and an N-type semiconductor.

In a step 3, furthermore, an electrode is formed on each of the P-type semiconductor and the N-type semiconductor.

In a subsequent step 4, a surface (a back surface) on an opposite side to a surface of the sapphire substrate on which the electrode is formed is coated with a light reflection preventing film. For example, the light reflection preventing film is obtained by coating a dielectric films having a high light transmittance, in a single-layer or a multilayer, through a vacuum evaporation method, spin coating process, or etc.

In a step 5, then, each light emitting device formed on the sapphire substrate is cut into individual pieces by dicing. Consequently, there is obtained the light emitting device 102 on which the light reflection preventing film 130 is formed. The light emitting device 102 is mounted by setting, as an upper surface, a surface on which the light reflection preventing film 130 is formed.

Next, an example of the method of manufacturing the semiconductor device 100 will be described in order with reference to FIGS. 3A to 3L. In the following drawings, the portions described above have the same reference numerals and description will be omitted in some cases.

Figure 3A:
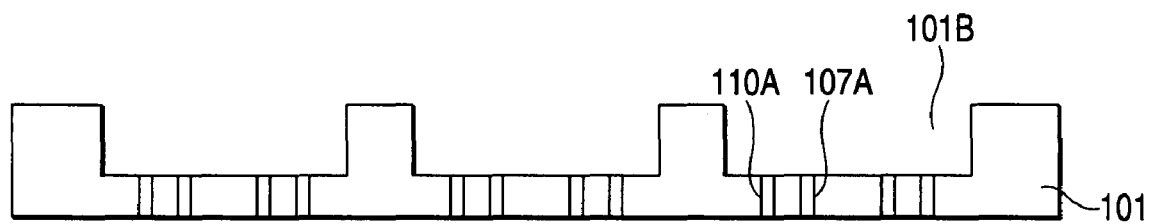
FIG. 3A is a view showing a method of manufacturing a semiconductor device in FIG. 1 (No. 1)

First of all, at a step shown in FIG. 3A, the substrate 101 formed of Si, for example, is etched and patterned to form the concave portion 101B for disposing a light emitting device and via holes 107A and 110A penetrating through the substrate 101 which serve to form the via plugs 107 and 110.

Figure 3B:
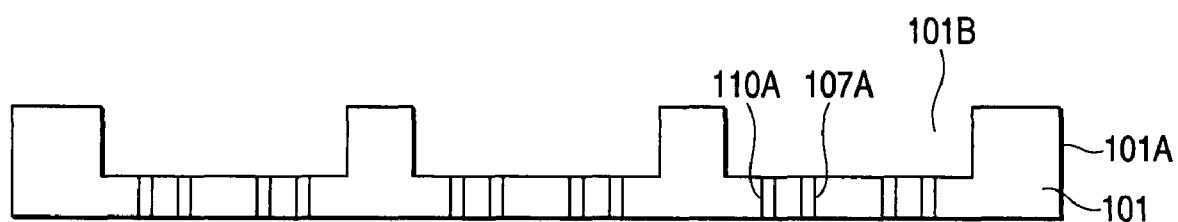
FIG. 3B is a view showing the method of manufacturing a semiconductor device in FIG. 1 (No. 2)

At a step shown in FIG. 3B, next, the oxide film (which is also referred to as a silicon oxide film or a thermal oxide film) 101A is formed by a thermal CVD method, for example, on a surface of the substrate 101 including an internal wall surface of the concave portion 101B and internal wall surfaces of the via holes 107A and 110A.

Figure 3C:
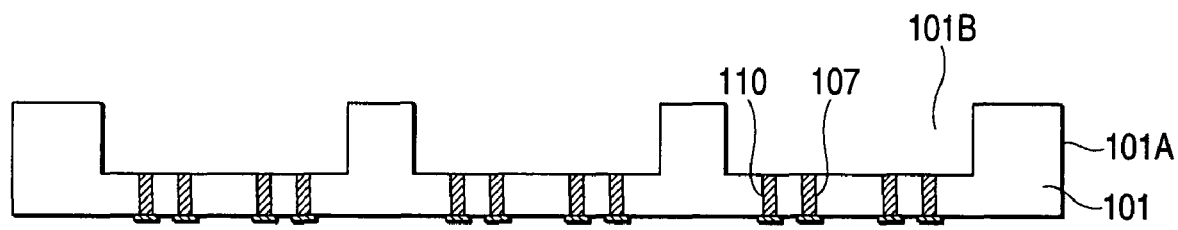
FIG. 3C is a view showing the method of manufacturing a semiconductor device in FIG. 1 (No. 3)

At a step shown in FIG. 3C, subsequently, the via plugs 107 and 110 are formed on the via holes 107A and 110A by a Cu plating method (such as a semiadditive method), for example, respectively.

Figure 3D:
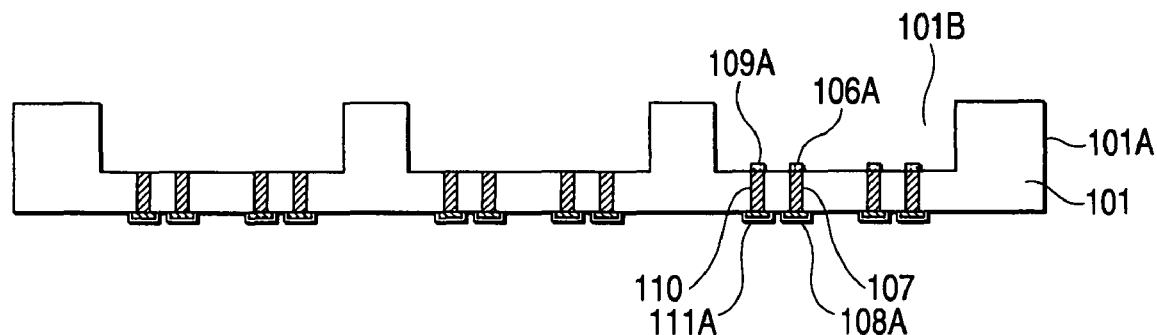
FIG. 3D is a view showing the method of manufacturing a semiconductor device in FIG. 1 (No. 4)

At a step shown in FIG. 3D, then, connecting layers 106A, 109A, 108A and 111A formed of Ni/Au, for example, are provided by a plating method, for example. In this case, the connecting layers 106A and 109A are formed on a side of the concave portion 101B of the via plugs 107 and 110 respectively, and the connecting layers 108A and 111A are formed on an opposite side of the via plugs 107 and 110 to the concave portion 101B respectively.

Figure 3E:
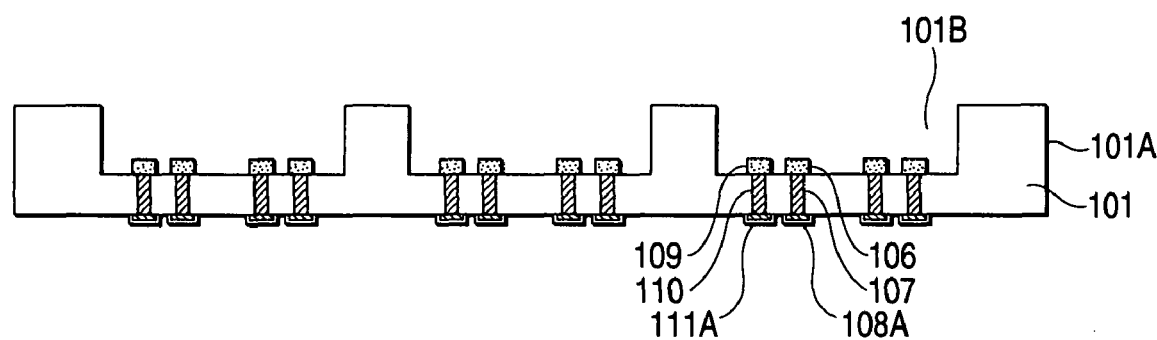
FIG. 3E is a view showing the method of manufacturing a semiconductor device in FIG. 1 (No. 5)

At a step shown in FIG. 3E, thereafter, the bumps (Au bumps) 106 and 109 are formed on the connecting layers 106A and 109A. After FIG. 3E, the connecting layers 106A and 109A are omitted.

Figure 3F:
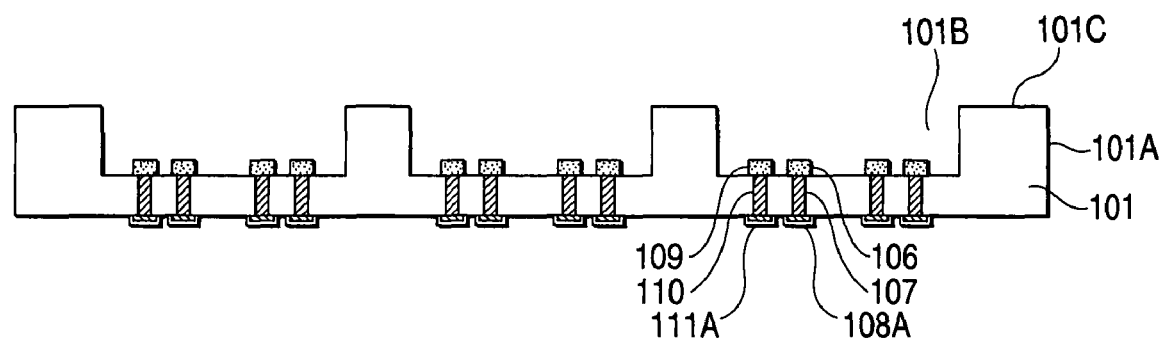
FIG. 3F is a view showing the method of manufacturing a semiconductor device in FIG. 1 (No. 6)

At a step shown in FIG. 3F, next, the oxide film 101A provided on a surface of a convex portion 101C around the concave portion 101B is removed by mask etching, for example. A cover formed of a glass is bonded, at a subsequent step, to a portion from which the oxide film is removed at the step.

Figure 3G:
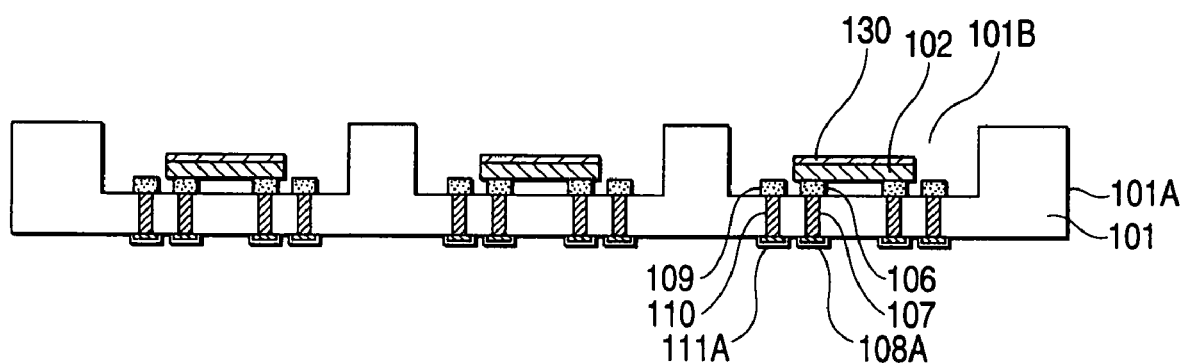
FIG. 3G is a view showing the method of manufacturing a semiconductor device in FIG. 1 (No. 7)

At a step shown in FIG. 3G, then, the light emitting device 102 having the light reflection preventing film 130 formed thereon by the steps 1 to 5 is disposed in the concave portion 101B by setting, as an upper surface, a surface on which the light reflection preventing film 130 is formed. In this case, for example, thermal compression bonding or ultrasonic bonding is used to electrically bond the light emitting device 102 to the bump 106 and to electrically connect the light emitting device 102 to the via plug 107 through the bump 106.

Figure 3H:
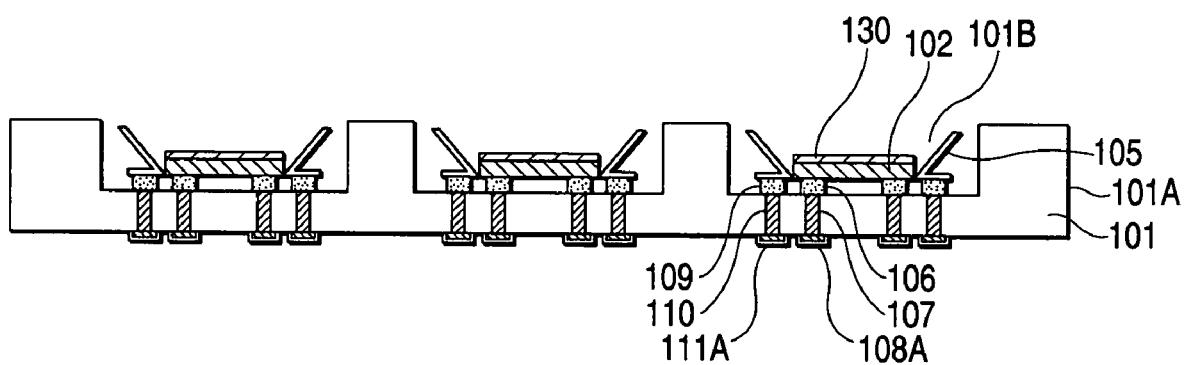
FIG. 3H is a view showing the method of manufacturing a semiconductor device in FIG. 1 (No. 8)

At a step shown in FIG. 3H, thereafter, the reflector 105 obtained by forming a reflecting film of Ag or Al on a surface of an alloy of Fe, Ni or Co, for example, is disposed in the concave portion 101B. In this case, for example, thermal compression bonding or ultrasonic bonding is used to bond the reflector 105 to the bump 109 and to connect the reflector 105 to the via plug 110 through the bump 109.

Figure 3I:
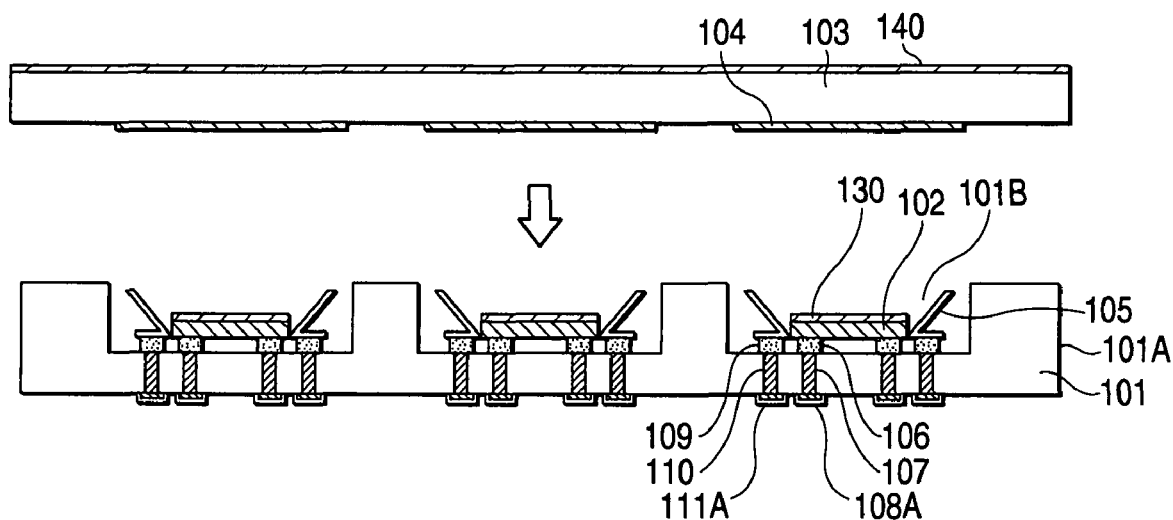
FIG. 3I is a view showing the method of manufacturing a semiconductor device in FIG. 1 (No. 9)

At a step shown in FIG. 3I, next, an upper surface of the plate-shaped cover 103 which is formed by a borosilicate glass, for example, and has a transparency is coated, in a multilayer, with a dielectric film having a high light transmittance by a vacuum evaporation method, thereby forming the light reflection preventing film 140. Furthermore, the phosphor film 104 is formed on a lower surface of the cover 103 by patterning. In the method of manufacturing a semiconductor device according to the first embodiment, the light reflection preventing film 140 and the phosphor film 104 are formed on the upper and lower surfaces of the plate-shaped cover 103 as described above. Therefore, a uniformity of a thickness of each of the light reflection preventing film 140 and the phosphor film 104 can be maintained to be high. Therefore, it is possible to enhance an intensity of a light emission and a uniformity of a luminescent color in the semiconductor device.

In this case, moreover, it is preferable that the phosphor film 104 should not be formed in a portion in which the cover 103 is bonded to the substrate 101 but the phosphor film 104 should be patterned in such a manner that the cover 103 directly comes in contact with the substrate 101.

Figure 3J:
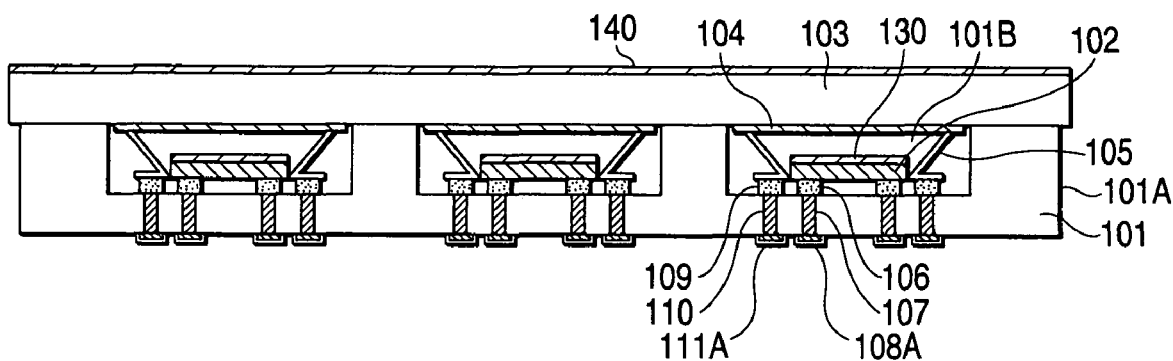
FIG. 3J is a view showing the method of manufacturing a semiconductor device in FIG. 1 (No. 10)

At a step shown in FIG. 3J, next, the cover 103 and the substrate 101 are bonded to each other through anode bonding, for example, and a structure for sealing the light emitting device 102 over the substrate 101 is formed. In this case, the anode bonding is carried out by applying a high voltage between the cover 103 and the substrate 101 and raising the temperatures of the cover 103 and the substrate 101.

When the anode bonding is carried out, Si constituting the substrate is coupled to oxygen in the glass constituting the cover so that stable bonding with a great bonding force is performed. Differently from bonding using a resin material, moreover, a gas and an impurity which contaminate a space for sealing the light emitting device 102 are rarely generated.

Figure 3K:
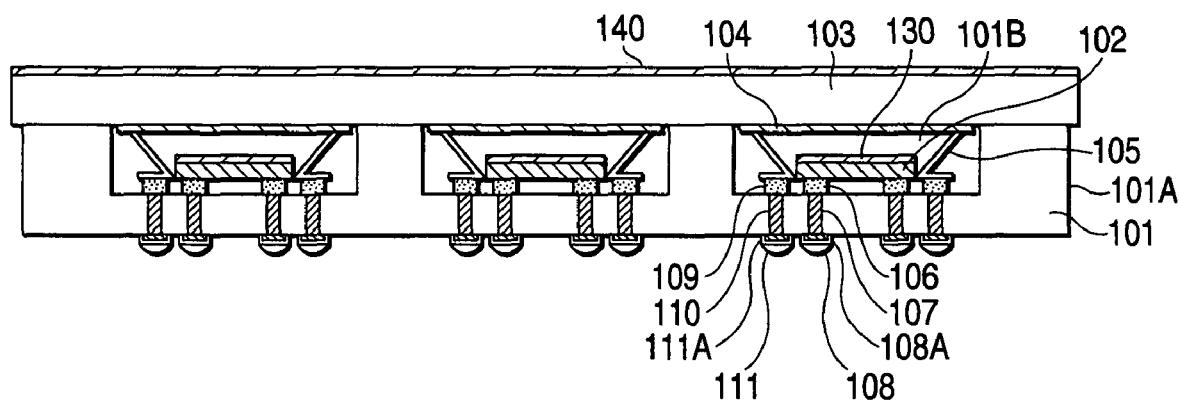
FIG. 3K is a view showing the method of manufacturing a semiconductor device in FIG. 1 (No. 11)

At a step shown in FIG. 3K, subsequently, the solder bumps 108 and 111 are formed on the connecting layers 108A and 111A, respectively.

Figure 3L:
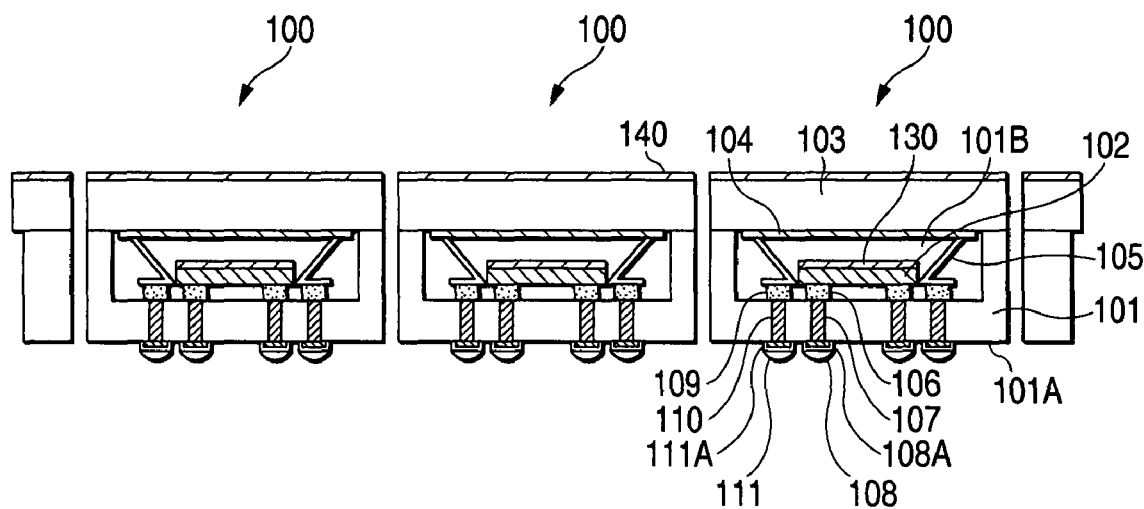
FIG. 3L is a view showing the method of manufacturing a semiconductor device in FIG. 1 (No. 12)

At a step shown in FIG. 3L, then, the substrate 101 and the cover 103 are cut into individual pieces by dicing. Consequently, the semiconductor device 100 (see FIG. 2) described above is finished.

While the description has been given to the case in which the light reflection preventing film 130 provided on the light emitting device 102 is formed before the cutting into the individual pieces, it is also possible to use a method of forming and patterning the light reflection preventing film 130 after mounting the light emitting device 102 on the substrate 101.

In case of a wafer level package, moreover, it is also possible to form the light reflection preventing film 140 on the cover 103 before or after cutting into individual pieces of the package.

Furthermore, the light reflection preventing film may be formed on a side wall of the cover 103 in addition to the upper surface thereof. In that case, only the cover 103 may be subjected to half dicing when cutting the cover 103 and the side surface of the cover 103 may be then coated with a dielectric film in a multilayer to form the light reflection preventing film.

Second Embodiment

Moreover, the semiconductor device according to the invention is not restricted to the structure described in the first embodiment but various structures can be employed as will be described below, for example.

Figure 4:
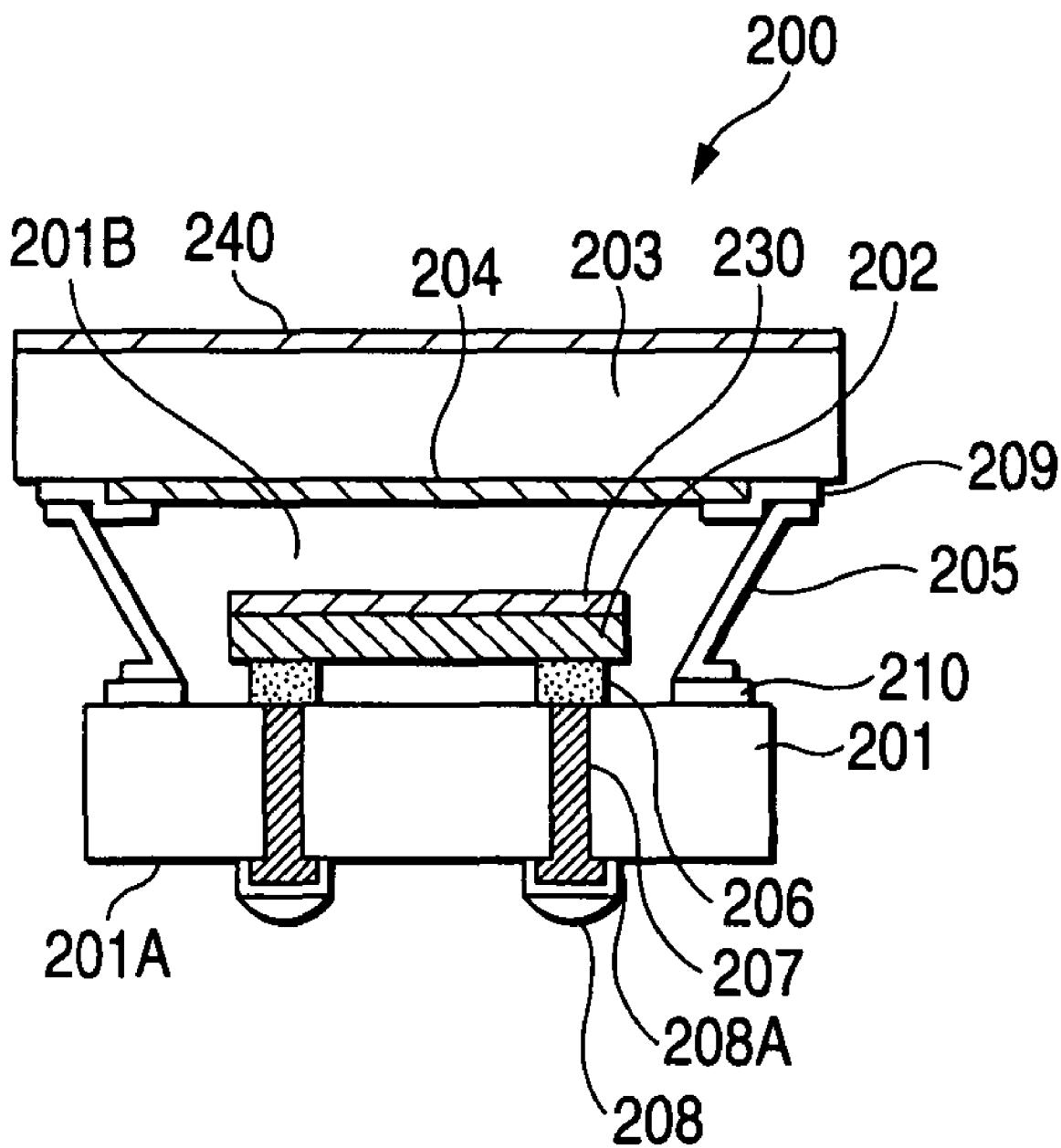
FIG. 4 is a view showing a semiconductor device according to a second embodiment of the invention.

FIG. 4 is a sectional view typically showing a semiconductor device 200 according to a second embodiment of the invention. Referring to FIG. 2, the semiconductor device 200 is obtained by mounting a light emitting device 202 formed by an LED, for example, on a substrate 201 formed of Si, for example. The light emitting device 202 has a P layer, an N layer and an electrode formed thereon by using sapphire ($Al_2O_3$) as a base material, and an upper surface thereof is provided with a light reflection preventing film 230 for preventing a reflection of a light. For example, the light reflection preventing film 230 is a transparent film obtained by coating a dielectric film having a high light transmittance, in a single-layer or a multilayer, through a vacuum evaporation method, spin coating process, or etc.

Moreover, a light transmitting plate-shaped cover 203 formed of a glass, for example, is disposed above the light emitting device 202 and a light reflection preventing film 240 for preventing a reflection of a light is also formed on an upper surface of the cover 203. The light reflection preventing film 240 is constituted by a single-layer or multilayer reflection preventing film in the same manner as the light reflection preventing film 230, and the reflection of the light can be prevented to relatively increase the amount of the light transmitted through the cover 203. In a process in which the light emitted from the light emitting device 202 is transmitted through the cover 203 and proceeds from the cover 203 formed of a glass having a high refractive index to the air having a low refractive index, therefore, a total reflection can be prevented. Consequently, it is possible to enhance an intensity of a light proceeding in an upward direction of the cover 203.

In the second embodiment, the description has been given to the example of the structure in which the light reflection preventing film 230 is formed on the upper surface of the light emitting device 202 and the light reflection preventing film 240 is also formed on the upper surface of the cover 203 in order to increase the intensity of the light irradiated from the semiconductor device 200. In the invention, however, it is also possible to employ a structure in which both of the light reflection preventing films 230 and 240 are formed or either of the light reflection preventing films 230 and 240 is formed. By employing a structure in which the light reflection preventing film is formed on a lower surface of the cover 203 as well as the upper surface thereof, moreover, it is possible to increase a light transmittance, thereby enhancing an intensity of the light in the case in which a phosphor film 204 to be described below is formed by a substance having a higher refractive index than that of the glass, for example.

In the second embodiment, the description has been given to the structure in which the light emitting device 202 is mounted on the substrate 201. However, it is a matter of course that the invention can also be applied to a semiconductor device having a structure in which a light receiving device is mounted instead of the light emitting device, for example. In that case, the light reflection preventing films 230 and 240 prevent a reflection of a light incident from an outside, thereby increasing an intensity of a light to be received.

Furthermore, the phosphor film 204 is formed on a lower surface of the cover 203. In this case, the substrate 201, the light emitting device 202, the cover 203 and the phosphor film 204 according to the second embodiment correspond to the substrate 101, the light emitting device 102, the cover 103 and the phosphor film 104 according to the first embodiment, and the semiconductor device 200 according to the second embodiment has the same advantages as those of the semiconductor device 100 according to the first embodiment.

More specifically, the light emitting device (LED) is not directly coated with a phosphor film or a resin containing a phosphor in the semiconductor device 200. Consequently, the radiation of the light emitting device 202 can be enhanced, resulting in a suppression in the influence of a deterioration in quality due to the heat generation of the light emitting device.

In the phosphor film 204, moreover, the influence of a deterioration due to the radiation from the light emitting device 202 and the irradiation of ultraviolet rays can be suppressed so that the quality of the semiconductor device can be improved and a lifetime can be prolonged.

In the semiconductor device 200 according to the second embodiment, moreover, the phosphor film is formed on the almost plate-shaped cover 203 by a printing method, for example. Therefore, the semiconductor device 200 has a feature that a thickness of the phosphor film has a high uniformity. More specifically, in the semiconductor device 200 according to the second embodiment, the phosphor film 204 is formed on the plate-shaped cover 203. Therefore, it is possible to form the phosphor film 204 with a high uniformity of the thickness by using the printing method, for example. In the semiconductor device 200 according to the second embodiment, furthermore, it is not necessary to form a phosphor film on a side surface of the light emitting device 202. Therefore, the semiconductor device 200 has a feature that an intensity of a light emission and a uniformity of a luminescent color are enhanced.

Furthermore, the light emitting device 202 is disposed on a bump (Au bump) 206 formed of Au, for example, and is electrically connected to a via plug (through wiring) 207 formed to penetrate through a bottom face of the substrate 201 via the bump 206.

A connecting layer 208A formed by an Ni/Au plated layer, for example, is provided on an opposite side to a side of the via plug 207 on which the light emitting device 202 is connected, and furthermore, a solder bump 208 is formed on the connecting layer 208A. More specifically, the via plug 207 is formed so that the light emitting device 202 and a connecting target on an outside of the space for sealing the light emitting device 202 can easily be connected to each other. Although a connecting layer formed by the Ni/Au plated layer, for example, may be formed between the bump 206 and the via plug 207, moreover, it is not shown in the drawing.

Moreover, an oxide film (a silicon oxide film) 201A is formed on a surface of the substrate 201 and the substrate 201 is insulated from the via plug 207 and the bump 206, for example.

The semiconductor device 200 according to the second embodiment is different from the semiconductor device 100 according to the first embodiment in the following respects and has advantages which are peculiar to the second embodiment.

The semiconductor device 200 according to the second embodiment has a reflector 205 (corresponding to the reflector 105) for reflecting a light emitted from the light emitting device 202, and furthermore, the reflector 205 forms a sealing space 201B for sealing the light emitting device 202 together with the substrate 201 and the cover 203.

In this case, one of ends of the reflector 205 is bonded to the substrate 201 through a bonding layer 210 such as Au which is formed on the substrate 201. Moreover, the other end of the reflector 205 is bonded to the cover 203 through a bonding layer 209 formed of Au, for example. More specifically, the reflector 205 is bonded to both the substrate 201 and the cover 203 so that the sealing space 201B for sealing the light emitting device 202 is formed.

Therefore, the sealing space 201B can be brought into a pressure reducing state or can be filled with an inactive gas, for example. Thus, the quality of the light emitting device 202 can be maintained and a lifetime can be prolonged.

Moreover, it is also possible to employ a structure in which a radiation wiring corresponding to the via plug 110 described in the first embodiment is formed on the substrate 201 and is connected to the reflector 205 so that a radiating property of the reflector 205 can be enhanced (the same structure as that in the first embodiment).

In the semiconductor device 200 according to the second embodiment, the structure (shape) of the substrate 201 is simpler than the substrate 101 and has a feature that the substrate 201 can easily be processed. With the structure, moreover, the reflector is exposed to the outside air. Therefore, there is an advantage that the radiating property is more excellent than that of the semiconductor device 100.

Next, an example of the method of manufacturing the semiconductor device 200 will be described in order with reference to FIGS. 5A to 5M. In the following drawings, the portions described above have the same reference numerals and description will be omitted in some cases.

Figure 5A:
FIG. 5A is a view showing a method of manufacturing a semiconductor device in FIG. 4 (No. 1)

First of all, at a step shown in FIG. 5A, the substrate 201 formed of Si, for example, is etched and patterned to form a via hole 207A penetrating through the substrate 201 which serves to form the via plug 207.

Figure 5B:
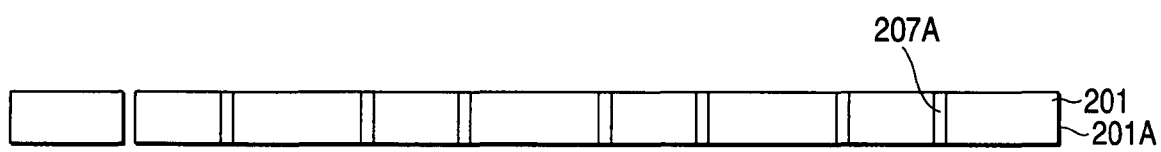
FIG. 5B is a view showing the method of manufacturing a semiconductor device in FIG. 4 (No. 2)

At a step shown in FIG. 5B, next, an oxide film (which is also referred to as a silicon oxide film or the thermal oxide film) 201A is formed by a thermal CVD method, for example, on a surface of the substrate 201 including an internal wall surface of the via hole 207A.

Figure 5C:
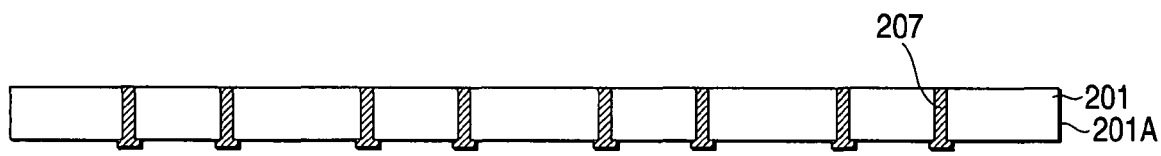
FIG. 5C is a view showing the method of manufacturing a semiconductor device in FIG. 4 (No. 3)

At a step shown in FIG. 5C, subsequently, the via plug 207 is formed in the via hole 207A by a Cu plating method (such as a semiadditive method), for example.

Figure 5D:
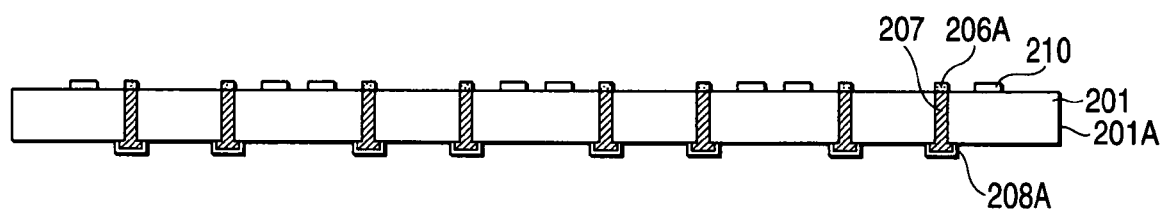
FIG. 5D is a view showing the method of manufacturing a semiconductor device in FIG. 4 (No. 4)

At a step shown in FIG. 5D, then, connecting layers 206A and 208A formed of Ni/Au, for example, are provided for the via plug 207 by a plating method, for example. In this case, for the via plug 207, the connecting layer 206A is formed on a first side on which a light emitting device is to be mounted at a subsequent step and the connecting layer 208A is formed on a second side which is opposite to the first side. Moreover, the bonding layer 210 formed of Au, for example, which serves to bond the reflector at a subsequent step is provided on the first side of the substrate 201 by a sputtering method or a plating method. After FIG. 5D, the connecting layers 206A and 209A are omitted.

Figure 5E:
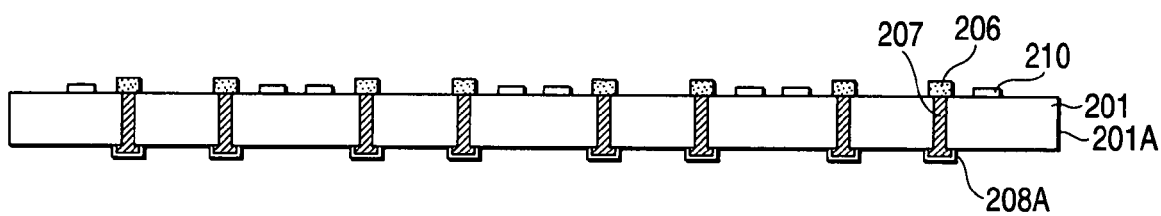
FIG. 5E is a view showing the method of manufacturing a semiconductor device in FIG. 4 (No. 5)

At a step shown in FIG. 5E, thereafter, the bump (Au bump) 206 is formed on the connecting layer 206A.

Figure 5F:
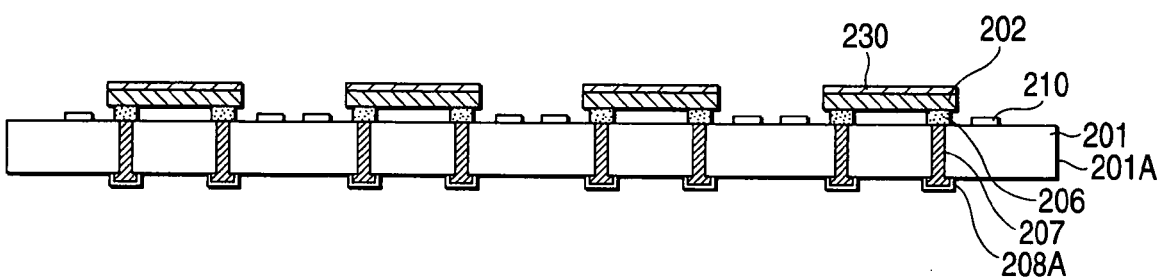
FIG. 5F is a view showing the method of manufacturing a semiconductor device in FIG. 4 (No. 6)

At a step shown in FIG. 5F, next, the light emitting device 202 formed by an LED is disposed on the substrate 201, for example. In this case, for example, thermal compression bonding or ultrasonic bonding is used to electrically bond the light emitting device 202 having the light reflection preventing film 230 formed thereon by the steps 1 to 5 to the bump 206 and to electrically connect the light emitting device 202 and the via plug 207 to each other through the bump 206.

Figure 5G:
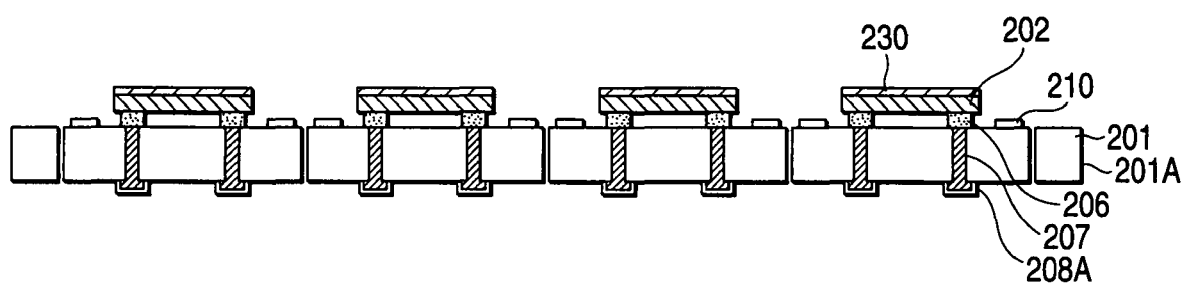
FIG. 5G is a view showing the method of manufacturing a semiconductor device in FIG. 4 (No. 7)

At a step shown in FIG. 5G, subsequently, the substrate 201 is cut by dicing. Thus, the substrate 201 having the light emitting device 202 mounted thereon is cut into individual pieces.

Figure 5H:
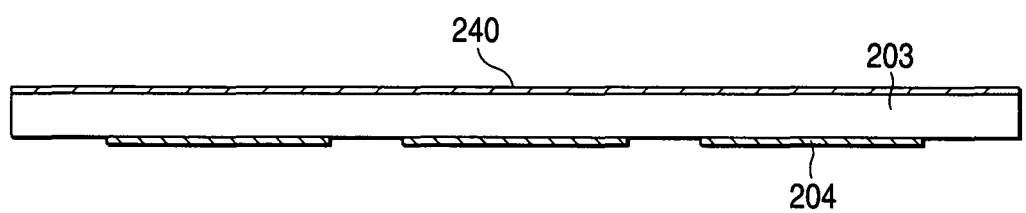
FIG. 5H is a view showing the method of manufacturing a semiconductor device in FIG. 4 (No. 8)

At a step shown in FIG. 5H, then, an upper surface of the plate-shaped cover 203 which is formed by a borosilicate glass, for example, is coated, in a multilayer, with a dielectric film having a high light transmittance by a vacuum evaporation method, for example, thereby forming the light reflection preventing film 240. Furthermore, the phosphor film 204 is formed on a lower surface of the cover 203 by patterning. In the method of manufacturing a semiconductor device according to the second embodiment, the light reflection preventing film 240 and the phosphor film 204 are formed on the upper and lower surfaces of the plate-shaped cover 203 as described above. Therefore, a uniformity of a thickness of each of the light reflection preventing film 240 and the phosphor film 204 can be maintained to be high. Therefore, it is possible to enhance an intensity of a light emission and a uniformity of a luminescent color in the semiconductor device 200.

Figure 5I:
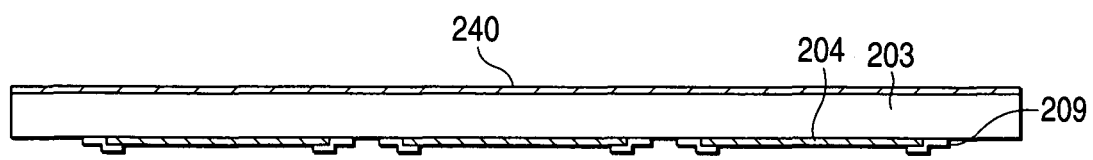
FIG. 5I is a view showing the method of manufacturing a semiconductor device in FIG. 4 (No. 9)

At a step shown in FIG. 5I, thereafter, the bonding layer 209 formed of Au, for example, through which the reflector 205 is to be bonded to the cover 203 at a subsequent step is provided by the sputtering method, for example.

Figure 5J:
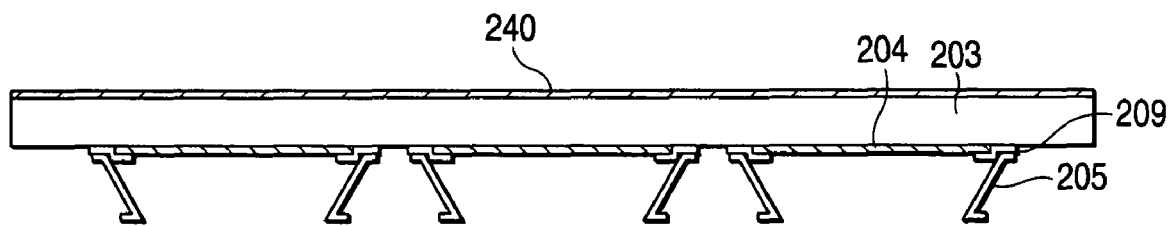
FIG. 5J is a view showing the method of manufacturing a semiconductor device in FIG. 4 (No. 10)

At a step shown in FIG. 5J, next, an upper end of the reflector 205 obtained by forming a reflecting film of Ag or Al on a surface of an alloy of Fe, Ni or Co, for example, is bonded to the bonding layer 209. In this case, the reflector 205 is bonded to the bonding layer 209 by using thermal compression bonding or ultrasonic bonding, for example.

Figure 5K:
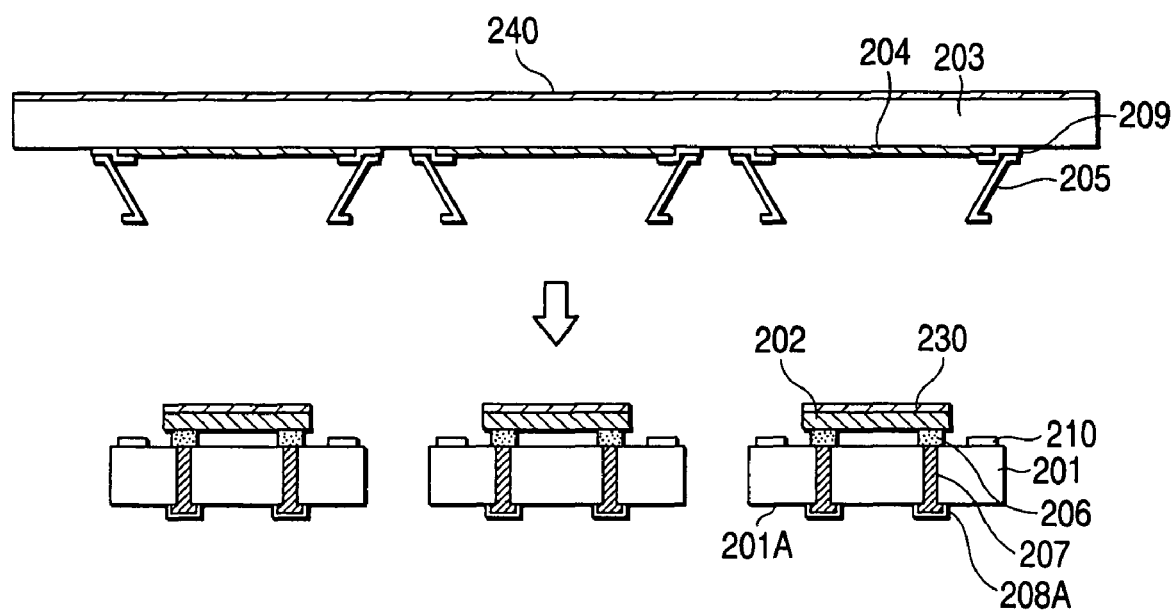
FIG. 5K is a view showing the method of manufacturing a semiconductor device in FIG. 4 (No. 11)

At a step shown in FIG. 5K, subsequently, a lower end of the reflector 205 bonded to the cover 203 is bonded to the substrate 201 having the light emitting device 202 mounted thereon. In this case, the reflector 205 is bonded to the bonding layer 210 by using the thermal compression bonding or the ultrasonic bonding, for example. Thus, the sealing space 201B in which the light emitting device 202 is sealed is formed so that the light emitting device 202 is sealed over the substrate 201.

Figure 5L:
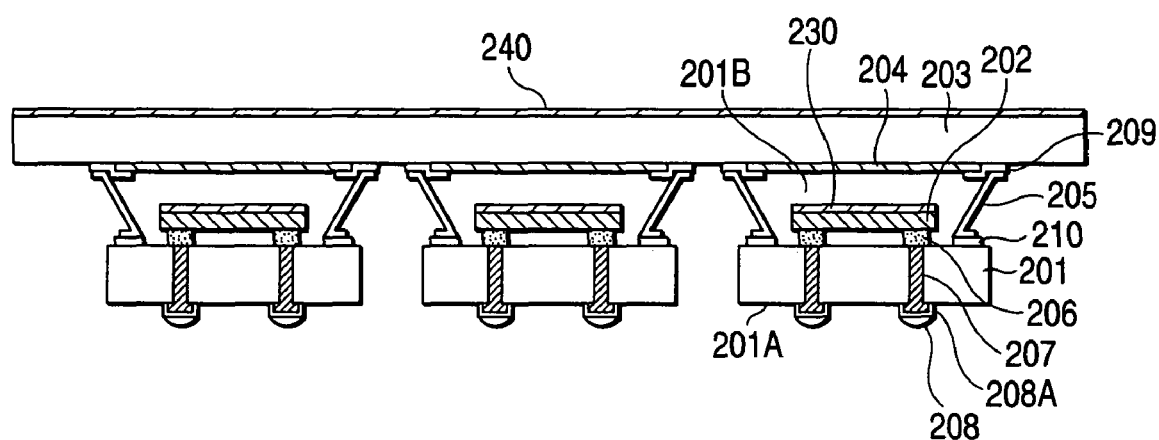
FIG. 5L is a view showing the method of manufacturing a semiconductor device in FIG. 4 (No. 12)

At a step shown in FIG. 5L, then, the solder bump 208 is formed on the connecting layer 208A.

Figure 5M:
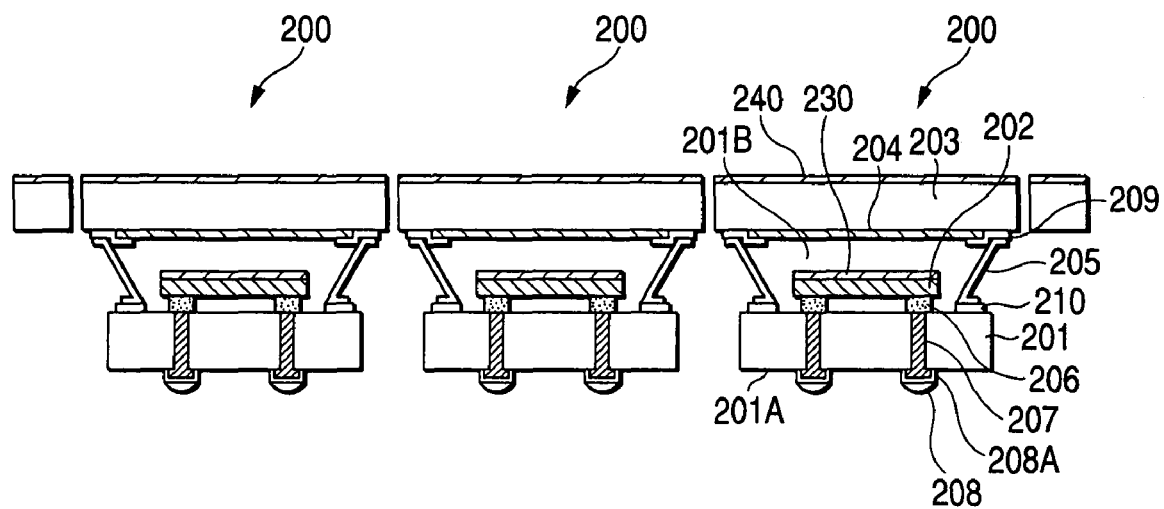
FIG. 5M is a view showing the method of manufacturing a semiconductor device in FIG. 4 (No. 13)

At a step shown in FIG. 5M, thereafter, the cover 203 is cut into individual pieces by dicing. Consequently, the semiconductor device 200 (see FIG. 4) described above can be formed.

In the semiconductor device 200 manufactured according to the second embodiment, the structure (shape) of the substrate 201 is simpler than that of the substrate 101 according to the first embodiment, and furthermore, the reflector is exposed to the outside air. Therefore, the semiconductor device 200 has a feature that a radiating property is more excellent than that of the semiconductor device 100 according to the first embodiment.

Third Embodiment

Figure 6:
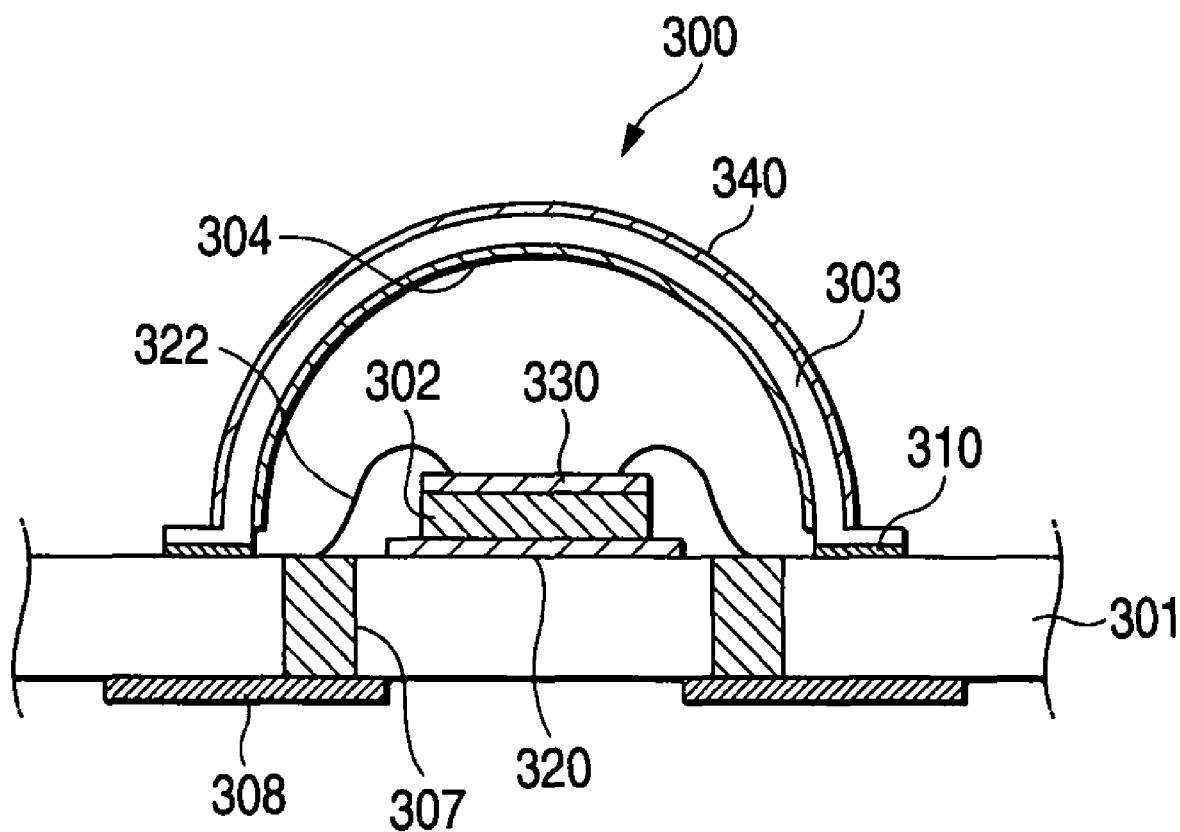
FIG. 6 is a view showing a semiconductor device according to a third embodiment of the invention.

FIG. 6 is a view showing a semiconductor device according to a third embodiment. As shown in FIG. 6, in a semiconductor device 300, a light emitting device 302 is fixed onto a substrate 301 through a bonding layer 320. A light reflection preventing film 330 is formed on an upper surface of the light emitting device 302.

The substrate 301 is provided with a via plug 307 penetrating from an upper surface to a lower surface, and a lower end of the via plug 307 is electrically connected to a wiring pattern 308 formed on a lower surface of the substrate 301. Furthermore, an upper end of the via plug 307 is connected to an electrode (not shown) of the light emitting device 302 through a bonding wire 322.

Moreover, a hemispherical cover 303 formed of a borosilicate glass, for example, is bonded through a bonding layer 310 to an upper surface of the substrate 301 on which the light emitting device 302 is mounted. The cover 303 is formed to have an inner part taking a hemispherical shape, and has a light reflection preventing film 340 formed on an outer peripheral surface and a phosphor film 304 formed on an inner peripheral surface.

The light reflection preventing films 330 and 340 are transparent films formed by coating a dielectric film having a high light transmittance in a multilayer through a vacuum evaporation method, for example, in the same manner as in the first and second embodiments. Accordingly, the light reflection preventing films 330 and 340 are formed by a single-layer or multilayer reflection preventing film in the same manner as in the first and second embodiments, and it is possible to relatively increase the amount of a light transmitted through the light emitting device 302 and the cover 303 by preventing a reflection of the light. In a process in which a light emitted from the light emitting device 302 is transmitted through the cover 303 to proceed from the cover 303 formed of a glass having a high refractive index to the air having a low refractive index, therefore, it is possible to prevent a total reflection. Consequently, it is possible to enhance an intensity of a light proceeding from the cover 303 to an outside.

In the third embodiment, the description has been given to the example of the structure in which the light reflection preventing film 330 is formed on the upper surface of the light emitting device 302 and the light reflection preventing film 340 is formed on the upper surface of the cover 303 in order to increase an intensity of a light irradiated from the semiconductor device 300. In the invention, however, it is also possible to employ a structure in which both of the light reflection preventing films 330 and 340 are formed or a structure in which either of the light reflection preventing films 330 and 340 is formed. By employing the structure in which the light reflection preventing film is formed on the inner peripheral surface of the cover 303 taking the hemispherical shape as well as the outer peripheral surface thereof, moreover, it is possible to increase a light transmittance, thereby enhancing a light intensity in the case in which the phosphor film 304 is constituted by a substance having a higher refractive index than that of a glass, for example.

In the third embodiment, the description has been given to the structure in which the light emitting device 302 is mounted on the substrate 301. However, it is a matter of course that the invention can also be applied to a semiconductor device having a structure in which a light receiving device is mounted instead of the light emitting device, for example. In that case, the light reflection preventing films 330 and 340 can prevent a reflection of a light which is incident from an outside, thereby increasing an intensity of the light to be received.

While the invention has been described above based on the preferred examples, the invention is not restricted to the specific examples but various changes and modifications can be made within the gist described in the claims.

Although the description has been given by taking, as an example, a light emitting device formed by an LED in the first to third embodiments, this is not restricted but it is apparent that the invention can also be applied to a semiconductor device in which a light emitting device other than the LED is mounted.

In the first to third embodiments, moreover, the description has been given to the case in which a light reflection preventing film is formed by a single-layer or multilayer reflection preventing film using a vacuum evaporation method or spin coating process. However, it is a matter of course that other thin film forming methods may be used to form the light reflection preventing film.

The cover for sealing the light emitting device which takes the shapes of the plate and the hemisphere has been taken as an example in the first to third embodiments. However, the shape of the cover is not restricted thereto. It is a matter of course that the cover may take a shape of a convex lens or a bottomed cylinder, for example.

FIG. 2

Step 1 Fabricate a sapphire substrate

Step 2 Create a P layer and an N layer on the sapphire substrate

Step 3 Form an electrode on the sapphire substrate

Step 4 Form a light reflection preventing film on a surface of the substrate

Step 5 Cut into individual LEDs by dicing

What is claimed is:

1. A semiconductor device comprising:
    a silicon substrate;
    an optical functional device mounted on the silicon substrate;
    a cover having a light transparency and being disposed above the optical functional device;
    a light reflection preventing film made of stacked dielectrics, which prevents a reflection of a light, formed on an upper surface of the cover; and
    a phosphor film formed on a lower surface of the cover,
    wherein there is a space between an upper surface of the optical functional device and the phosphor film formed on the lower surface of the cover, and
    wherein there is no light reflection preventing film formed on the upper surface of the optical functional device.

2. The semiconductor device according to claim 1, wherein the cover has the light reflection preventing film formed on at least one of a front surface or a back surface.

3. The semiconductor device according to claim 1, wherein the light reflection preventing film is a transparent film formed by coating a dielectric film.

4. The semiconductor device according to claim 1, wherein the optical functional device is a light emitting device for emitting a light, the semiconductor device further comprising:
    a reflector, which reflects a light, disposed to surround a side surface of the light emitting device.

5. The semiconductor device according to claim 4, wherein the optical functional device is mounted in a concave portion of the silicon substrate and the concave portion is sealed by bonding the cover to the silicon substrate.

6. The semiconductor device according to claim 1,
wherein the cover is a hemispherical cover bonded to the silicon substrate, and
wherein the light reflection preventing film is formed on an outer peripheral surface of the cover, the semiconductor device further comprising:
a phosphor film formed on an inner peripheral surface of the cover.

7. A method of manufacturing a semiconductor device comprising the steps of:
mounting an optical functional device on a silicon substrate;
sealing the optical functional device disposed on the silicon substrate by using a cover having a light transparency;
forming a light reflection preventing film on an upper surface of the cover, wherein the light reflection preventing film is made of stacked dielectrics; and
forming a phosphor film on a lower surface of the cover,
wherein there is a space between an upper surface of the optical functional device and the phosphor film formed on the lower surface of the cover, and
wherein there is no light reflection preventing film formed on the upper surface of the optical functional device.

8. The method of manufacturing a semiconductor device according to claim 7, wherein the light reflection preventing film is a transparent film formed by coating a dielectric film.

9. The method of manufacturing a semiconductor device according to claim 7, further comprising a step of:
forming the silicon substrate having a concave portion on which the optical functional device is mounted and an opening of the concave portion which is sealed with the cover.

10. The method of manufacturing a semiconductor device according to claim 7, wherein the optical functional device is a light emitting device for emitting a light,
the method further comprising a step of:
disposing a reflector for reflecting a light to surround a side surface of the light emitting device.

11. The method of manufacturing a semiconductor device according to claim 10, further comprising steps of:
bonding an upper end of the reflector to the cover; and
bonding a lower end of the reflector around a region, on which the optical functional device is mounted, of the silicon substrate, thereby sealing a space in which the optical functional device is mounted.

12. The method of making a semiconductor device according to claim 7,
wherein the cover is a hemispherical cover bonded to the silicon substrate, and
wherein the light reflection preventing film is formed on an outer peripheral surface of the cover,
the method further comprising a step of:
forming a phosphor film on an inner peripheral surface of the cover.

* * * * *